United States Patent [19]

Kusano

[11] Patent Number: 5,094,979

[45] Date of Patent: Mar. 10, 1992

[54] METHOD OF FABRICATING SEMICONDUCTOR DEVICE

[75] Inventor: Yuuji Kusano, Fukuoka, Japan

[73] Assignee: Mitsubishi Denki Kabushiki Kaisha, Tokyo, Japan

[21] Appl. No.: 698,326

[22] Filed: May 6, 1991

Related U.S. Application Data

[63] Continuation-in-part of Ser. No. 475,961, Feb. 6, 1990, abandoned.

[30] Foreign Application Priority Data

Mar. 3, 1989 [JP] Japan .................. 1-52249

[51] Int. Cl.⁵ .......................................... H01L 21/44
[52] U.S. Cl. ........................ 437/187; 437/189; 437/190; 437/183; 437/245; 437/246
[58] Field of Search ............ 437/189, 190, 187, 183, 437/245, 246

[56] References Cited

U.S. PATENT DOCUMENTS

| 3,571,913 | 3/1971 | Bodway | 437/189 |
| 4,816,424 | 3/1989 | Watanabe et al. | 437/190 |

FOREIGN PATENT DOCUMENTS

| 0161285 | 12/1979 | Japan | 437/190 |
| 0079451 | 6/1981 | Japan | 437/187 |
| 0085823 | 5/1986 | Japan | 437/246 |
| 125015 | 6/1986 | Japan | |
| 0280620 | 12/1986 | Japan | 437/245 |

*Primary Examiner*—Brian E. Hearn
*Assistant Examiner*—Trung Dang
*Attorney, Agent, or Firm*—Oblon, Spivak, McClelland, Maier & Neustadt

[57] ABSTRACT

In a method of fabricating a semiconductor device, a conductive thin film is first removed by anisotropic etching through masks of electrodes having fine patterns. Thus, the conductive thin film is prevented from side etching in electrode portions, to thereby prevent electrode separation and $V_{EBF}$ failure. Then, the electrodes are covered with a resist film, to remove a part of the conductive thin film left on a concave step portion of a non-electrode forming region by isotropic etching. Thus, a problem of shorting across a base and an emitter caused by movement on the basis of separation of the conductive thin film is solved.

5 Claims, 8 Drawing Sheets

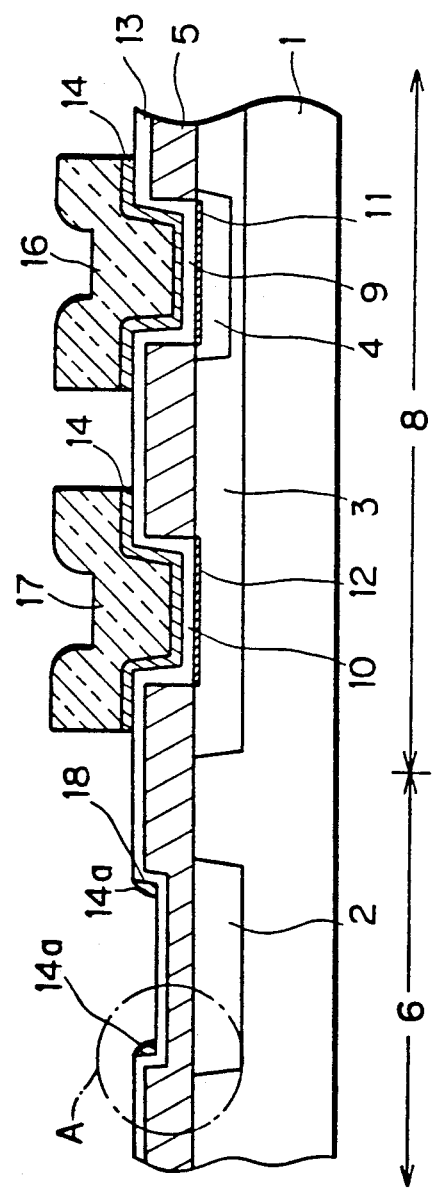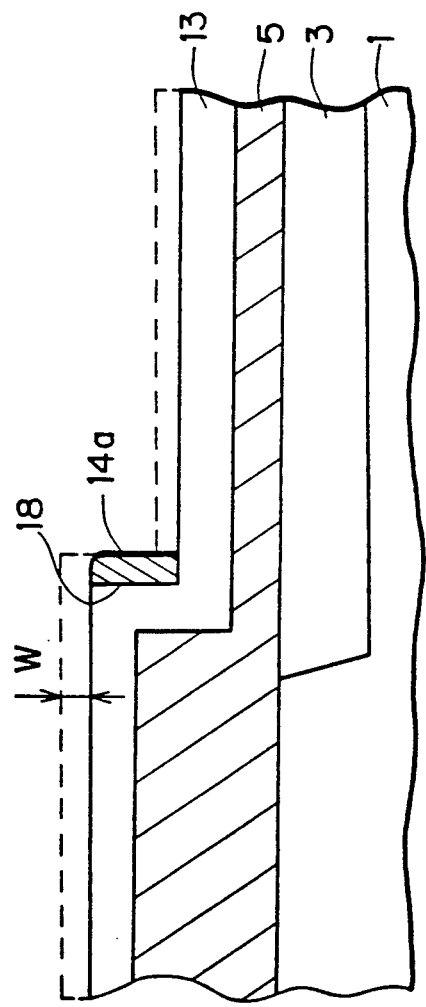

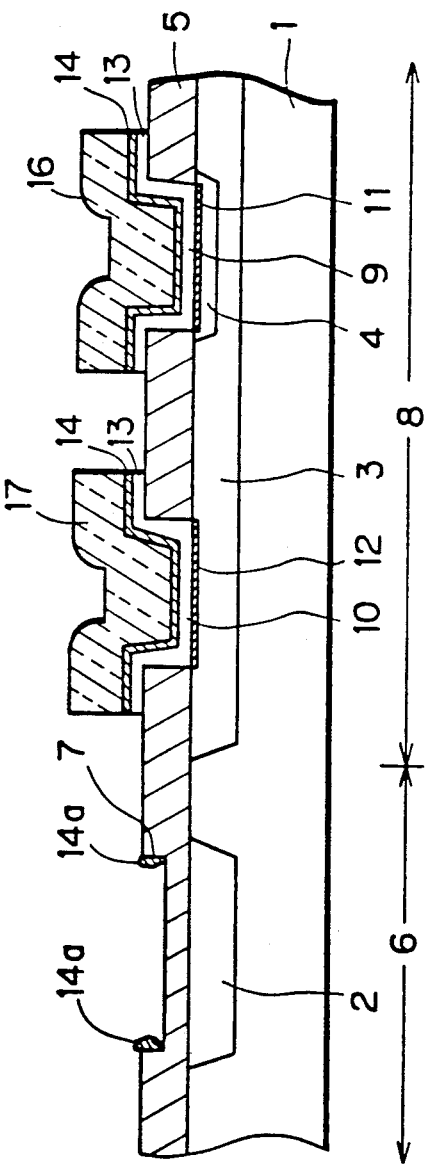
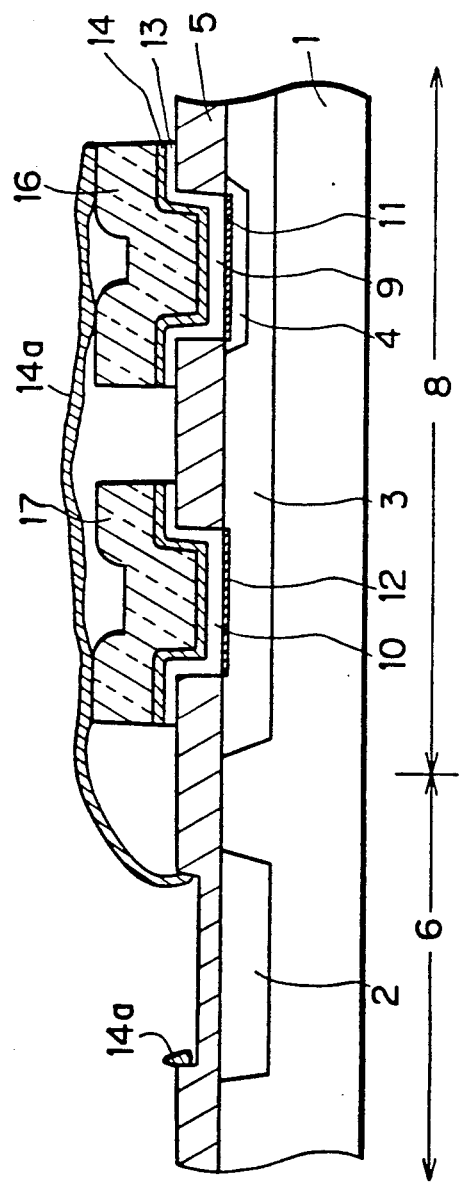

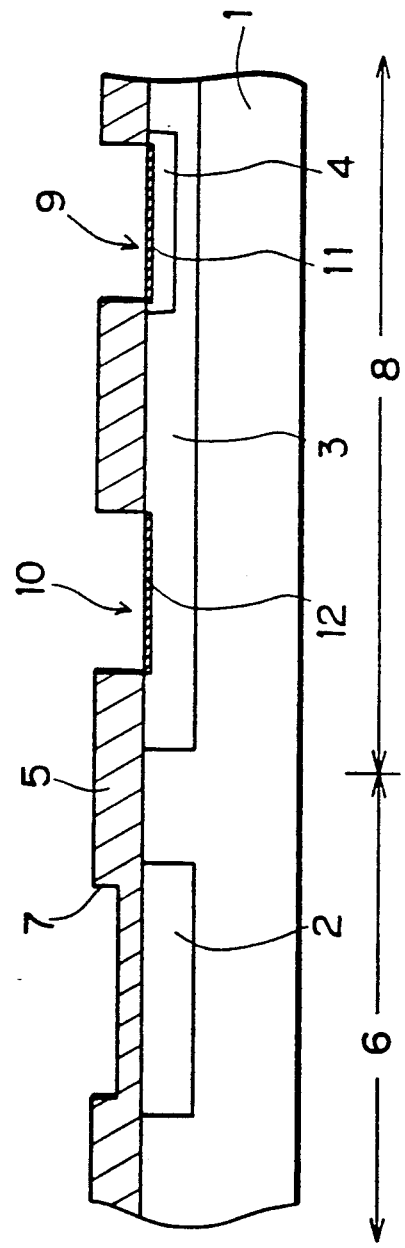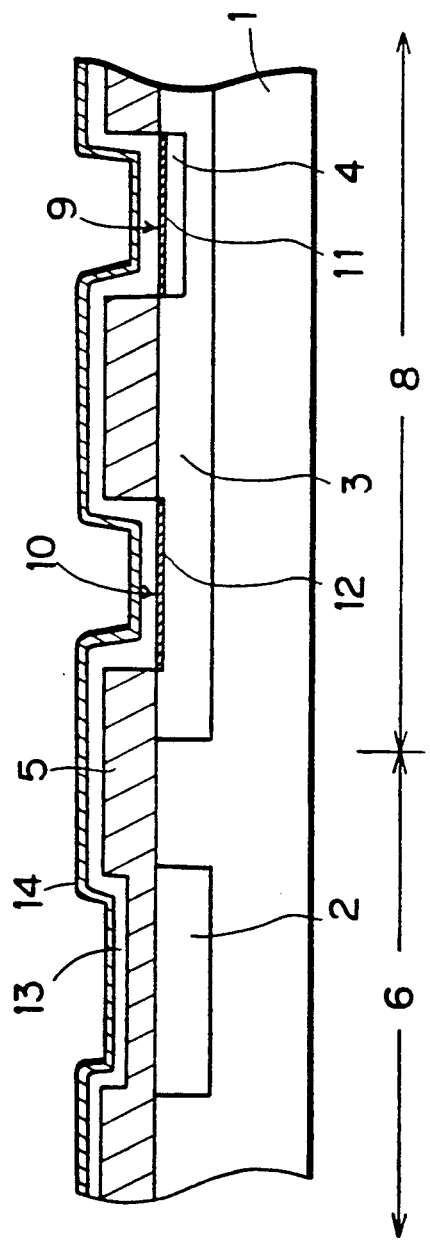

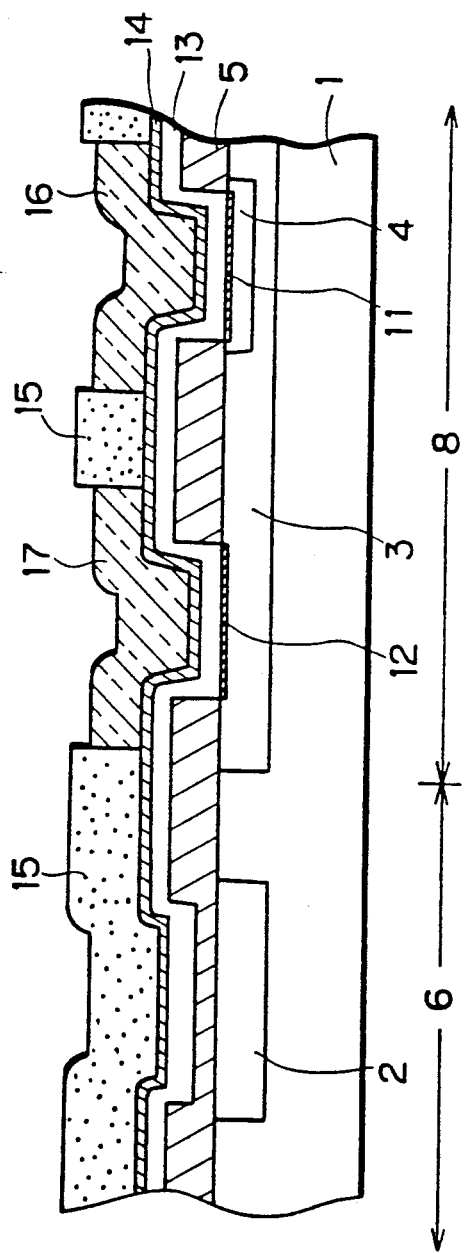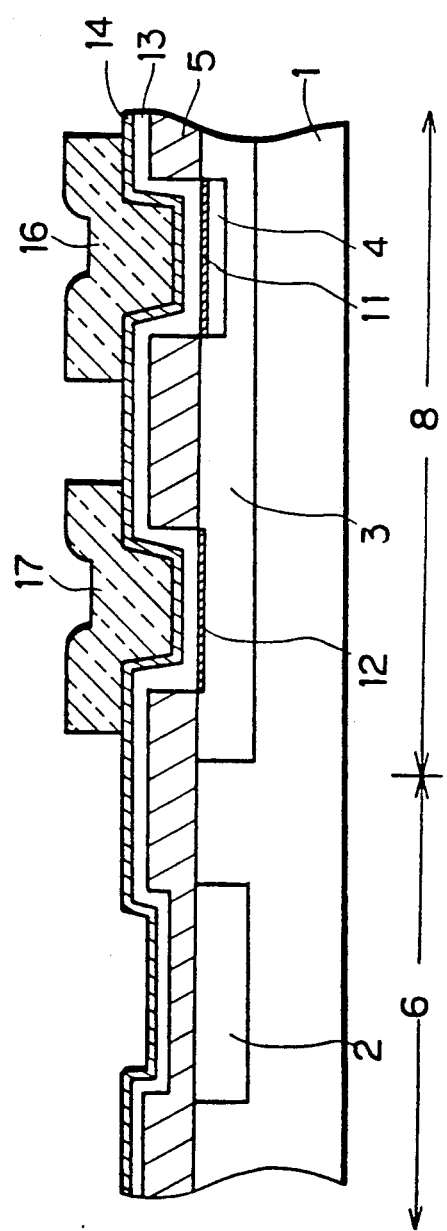

METHOD OF FABRICATING SEMICONDUCTOR DEVICE

This application is a continuation-in-part of application Ser. No. 07/475,961, filed on 02/06/90, now abandoned.

BACKGROUND OF THE INVENTION

1. Field of the Invention

The present invention relates to a method of fabricating a semiconductor device having fine pattern electrode structure, such as electrode structure of a high-frequency silicon transistor, for example.

2. Description of the Prior Art

FIGS. 1 to 8 are sectional views showing a conventional method of fabricating a high-frequency silicon transistor, respectively.

First, a P-type guard ring layer 2, a P-type base junction region 3 and an N-type emitter junction region 4 are formed on an N-type epitaxial layer 1 through a well-known impurity diffusion technique, as shown in FIG. 1. Numeral 5 denotes an insulating layer, which is formed by an oxide film through thermal oxidation. In this case, the N-type epitaxial layer 1 serves as a collector region. The guard ring layer 2 is adapted to increase the so-called $V_{CBO}$ breakdown voltage when reverse voltage is applied across the collector and the base. In general, this guard ring layer 2 is formed simultaneously with the base junction region 3 by providing an oxide film (part of the insulating layer 5) on a prescribed region of the N-type epitaxial layer 1 and selectively diffusing a P-type impurity into an upper layer part of the epitaxial layer 1 through the oxide film, which serves as a mask. In a similar manner, another oxide film (remaining part of the insulating layer 5) is formed on another prescribed region of the chip to cover the said oxide film and an N-type impurity is selectively diffused into an upper layer part of the base junction region 3 through the oxide film, which serves as a mask, to thereby form the emitter junction region 4. Consequently, a concave step portion 7 is defined in a section of the insulating layer 5 corresponding to the guard ring layer 2 within a non-electric forming region 6 shown in FIG. 1.

On the other hand, the insulating layer 5 is provided with a contact hole 9 in a position corresponding to the emitter junction region 4 for extracting an emitter electrode and with another contact hole 10 in a position corresponding to the base junction region 3 for extracting a base electrode, within an electrode forming region 8 shown in FIG. 1. In the case of the high-frequency silicon transistor, an opening portion of the insulating layer 5 defined in formation of the emitter junction region 4 is generally employed as the contact hole 9. Platinum silicide layers 11 and 12 are formed in the contact holes 9 and 10 respectively, in order to attain low ohmic contact resistance.

Then, a barrier metal layer 13 having substantially uniform thickness is formed on the chip to cover the insulating layer 5, as shown in FIG. 2. Further, a conductive thin film 14 of gold is formed on the barrier metal layer 13 by sputtering. In general, the thickness of the conductive thin film 14 is about 1000 Å.

Thereafter a photoresist film 15 is formed on a prescribed region of the conductive thin film 14 to serve as a mask for selectively forming an emitter electrode 16 and a base electrode 17 within the electrode forming region 8 respectively by electrolytic plating, as shown in FIG. 3. At this time, the conductive thin film 14 is adapted to effectively retain current flow in the electrolytic plating process. Further, the barrier metal layer 13 is adapted to prevent the semiconductor layer from intrusion of metal material atoms forming the electrodes 16 and 17 and the conductive thin film 14.

Then, the spent photoresist film 15 is removed as shown in FIG. 4.

Thereafter the electrodes 16 and 17 are utilized as masks to selectively remove the conductive thin film 14 by anisotropic etching such as sputter etching, for example, hardly causing side etching, as shown in FIG. 5. In the case of the high-frequency transistor, refinement of electrode patterns generally progresses with increase in frequency. Consequently, the electrodes 16 and 17 are reduced in width such that electrode separation or $V_{EBF}$ failure (degradation of voltage characteristics with respect to emitter-to-base forward voltage) is caused by slight side etching in electrode portions of the conductive thin film 14. Therefore, the conductive thin film 14 cannot be removed by isotropic etching which causes side etching, but is removed by anisotropic etching which hardly causes side etching.

As the result, a part 14a of the conductive thin film 14 is left in a concave step portion 18 of the barrier metal layer 13 located above the guard ring layer 2, as shown in FIG. 5. That is, the part 14a of the conductive film 14 is inevitably left when the conductive thin film 14 having thickness W is removed by anisotropic etching as shown in FIG. 6, which is an enlarged sectional view of a part A shown in FIG. 5.

If the barrier metal layer 13 is thereafter selectively removed by etching through the electrodes 16 and 17 serving as masks as shown in FIG. 7, therefore, the following problem is caused: Since the thickness W of the conductive thin film 14 is small and the concave step portion 7 of the insulating layer 5 has small depth of not more than 0.5 μm, a masking effect by the part 14a of the conductive thin film 14 is so reduced that the barrier metal layer 13 is side-etched at the concave step portion 7. Consequently, the part 14a of the conductive thin film 14 is barely left on the concave step portion 7 of the insulating layer 5 as shown in FIG. 7, or the part 14a of the conductive thin film 14 is separated to cross the base electrode 17 and the emitter electrode 16 extending in the form of stripes as shown in FIG. 8, to cause shorting across the emitter and the base.

SUMMARY OF THE INVENTION

The present invention is directed to a method of fabricating a semiconductor device having fine pattern electrode structure.

The inventive method of fabricating a semiconductor device comprises a step of forming an insulating layer over an electrode forming region and a non-electrode forming region on a semiconductor layer such that the insulating layer has contact holes in the electrode forming region and a concave step portion in the non-electrode forming region; a step of forming a conductor layer having substantially uniform thickness on the semiconductor layer to cover the insulating layer and electrically connecting the conductor layer to the semiconductor layer through the contact holes; a step of forming a conductive thin film on the conductor layer; a step of forming electrodes on the electrode forming region of the conductive thin film; a step of selectively removing the conductive thin film by anisotropic etching through the electrodes serving as masks; a step of removing a part of the conductive thin film unremoved in the anisotropic etching step and left on a concave step portion of the conductor layer by isotropic etching in a state of covering the electrodes with a resist film; and a step of removing the resist film and thereafter selectively removing the conductor layer by etching through the electrodes serving as masks.

Accordingly, an object of the present invention is to provide a method of fabricating a semiconductor device which can solve the problem of separation of fine pattern electrodes and $V_{EBF}$ failure caused by side etching while leaving no conductive thin film in a concave step portion of an insulating layer.

According to the inventive method of fabricating a semiconductor device, unwanted portions of the conductive thin film other than electrode portions are removed by anisotropic etching to prevent side etching at the electrode portions of the conductive thin film, to thereby prevent electrode separation and $V_{EBF}$ failure.

Further, a part of the conductive thin film left on the concave step portion of the insulating film is removed by isotropic etching, to thereby prevent shorting across the electrodes caused by movement on the basis of separation of the conductive thin film.

In this case, isotropic etching is performed in a state of covering the electrodes with a resist film, to thereby prevent electrode separation and $V_{EBF}$ failure.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 to 8 are sectional views showing a conventional method of fabricating a semiconductor device respectively; and FIGS. 9 to 15 are sectional views showing a method of fabricating a semiconductor device according to an embodiment of the present invention respectively.

DESCRIPTION OF THE PREFERRED EMBODIMENT

Figure 1:
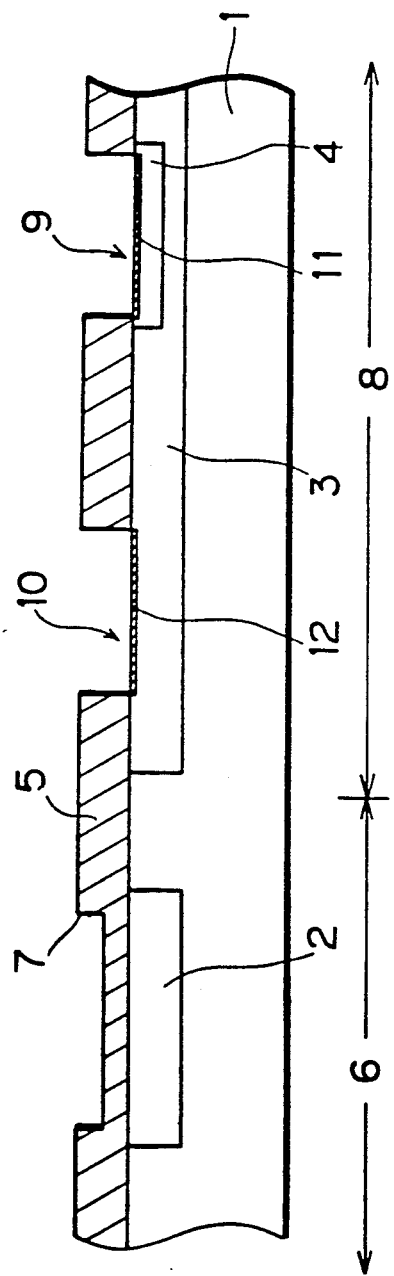
Figure 2:
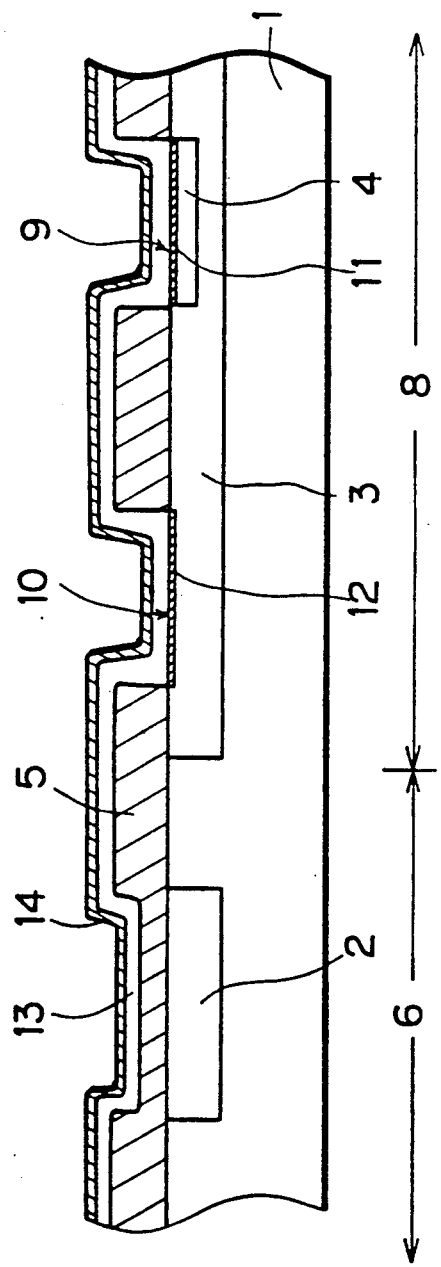
Figure 3:
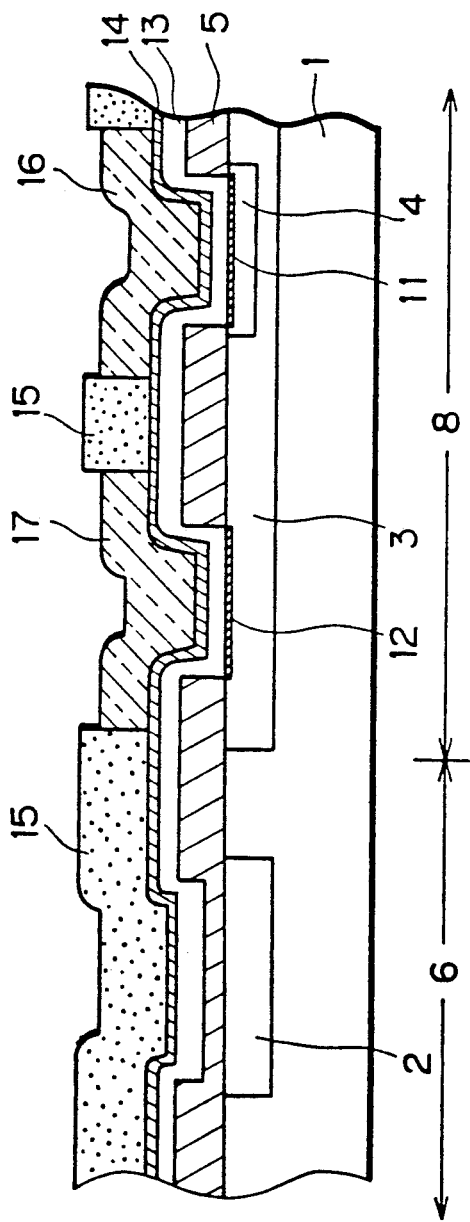
Figure 4:
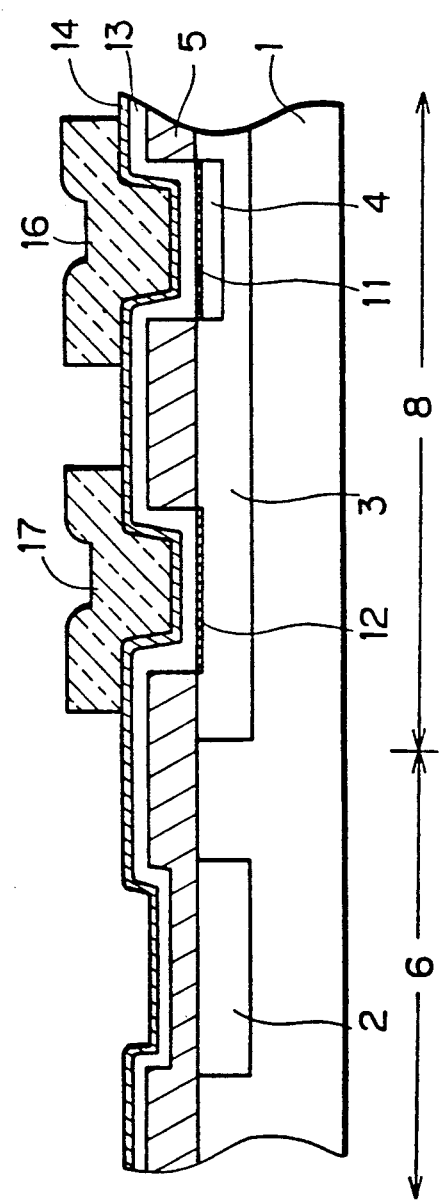

FIGS. 9 to 15 are sectional views for illustrating a method of fabricating a high-frequency silicon transistor according to an embodiment of the present invention respectively.

Similarly to the prior art, a P-type guard ring layer 2, a P-type base junction region 3 and an N-type emitter junction region 4 are formed on an N-type epitaxial layer 1 through an impurity diffusion technique, as shown in FIG. 9. Contact holes 9 and 10 are defined in an electrode forming region 8 of an insulating layer 5, and platinum silicide layers 11 and 12 are formed in the contact holes 9 and 10.

Then, a barrier metal layer 13 having substantially uniform thickness is formed on the chip to cover the insulating layer 5, as shown in FIG. 10. Barrier metal layer 13 may be formed of any metal which prevents metal atoms from conductive thin film 14 and electrodes 16 and 17 from reaching the underlying semiconductor material. Titanium tungsten or titanium nitride films having a thickness of approximately 2,000 Å to 4,000 Å are examples of materials suitable as a barrier metal layer 13. Further, a conductive thin film 14 of gold is formed on the barrier metal layer 13 by sputtering. Conductive thin film 14 has a thickness of 1,000 Å, for example.

Thereafter a photoresist film 15 is formed on a prescribed region of the conductive thin film 14 to serve as a mask for forming an emitter electrode 16 and a base electrode 17 by electrolytic plating, as shown in FIG. 11.

Then, the spent photoresist film 15 is removed as shown in FIG. 12.

Figure 13:
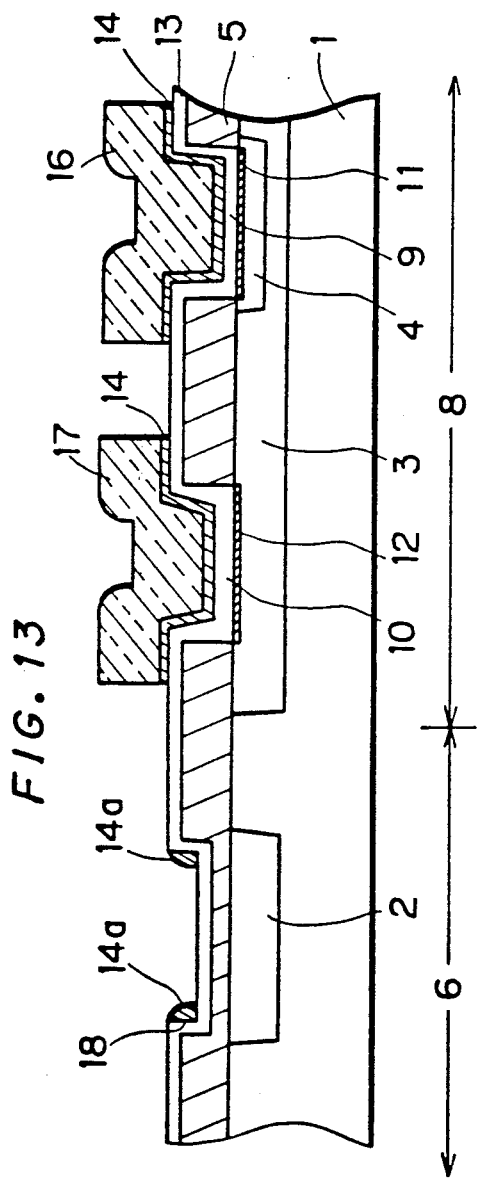

Thereafter the electrodes 16 and 17 are utilized as masks to selectively remove the conductive thin film 14 as shown in FIG. 13 by anisotropic etching such as sputter etching, for example, which hardly causes side etching. As the result, portions of the conductive thin film 14 corresponding to the electrodes 16 and 17 are prevented from side etching to thereby prevent electrode separation and $V_{EBF}$ failure, while a part 14a of the conductive thin film 14 is left in a concave step portion 18 of the barrier metal layer 13 within a non-electrode forming region 6. The above steps are identical to those of the prior art shown in FIGS. 1 to 5, and hence redundant description is omitted. Therefore, if the part 14a of the conductive thin film 14 is left intact, shorting is caused across the emitter and base electrodes 16 and 17 in a later step by movement of the part 14a of the conductive thin film 14 as hereinabove described in relation to the prior art.

Figure 14:
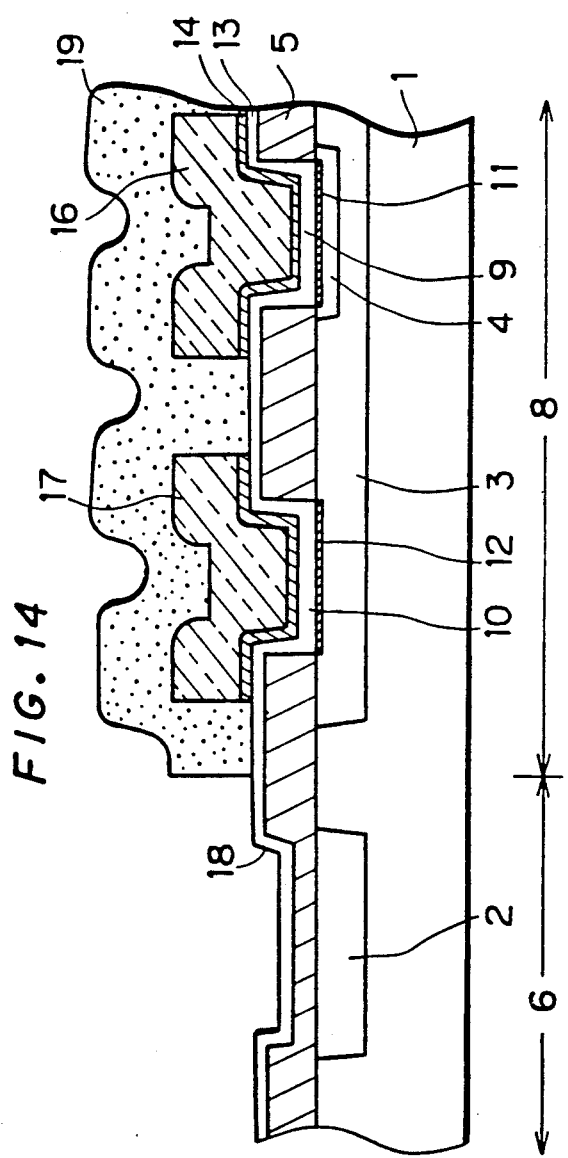

According to this embodiment, the emitter electrode 16 and the base electrode 17, which are provided in the form of stripes within the electrode forming region 8, are covered with a photoresist film 19, as shown in FIG. 14. In this state, the part 14a of the conductive thin film 14, which has been unremoved by the aforementioned anisotropic etching step, is removed by isotropic etching such as wet etching, for example. At this time, such isotropic etching causes no electrode separation or $V_{EBF}$ failure since the electrodes 16 and 17 are covered with the photoresist film 19.

Figure 15:
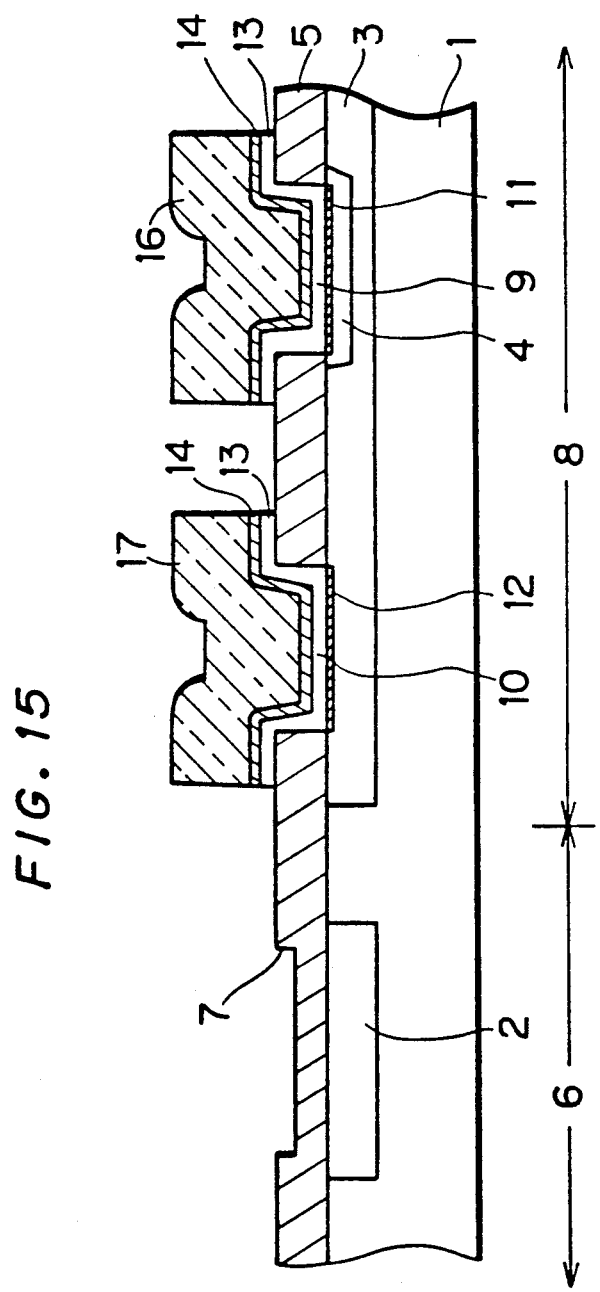

Thereafter the photoresist film 19 is removed and unwanted parts of the barrier metal layer 13 are removed by etching through the electrodes 16 and 17 serving as masks, as shown in FIG. 15. Metal layer 13 may be etched by plasma etching using sulfur hexafluoride ($SF_6$), for example, or by reactive ion etching (RIE), both of which exhibit moderate anisotropic compared to sputter etching. It is also possible to use isotropic etching, such as wet etching using a 30% hydrogen peroxide solution. For thickness of barrier metal layer 13 according to the invention, immersing the wafer in the 30% hydrogen peroxide solution for approximately two minutes at 40° C. would completely remove metal layer 13. This selective removal of the barrier metal layer 13 through etching above would result in a small amount of etching of the side walls of barrier metal layer 13 beneath the electrode 16 and 17. However, since the conductive thin film 14 is not etched, the total amount of uncutting of the metal layers 13 and 14 is small compared to the electrodes 16 and 17. Thus, no separation of the electrodes 16 and 17 occurs even in circuits having a fine electrode pattern. Thus, a high-frequency silicon transistor device is obtained.

The feature of the above embodiment will be described below. In order to improve high-frequency characteristics of a high-frequency silicon transistor, it is important to refine patterns to the minimum to thereby increase the emitter peripheral length with respect to the base area. In order to increase the emitter peripheral length with respect to the base area, it is generally necessary to reduce the space between the base and the emitter as well as to narrow the contact holes 9 and 10 in pattern width. In other words, it is necessary to reduce the electrode width and the electrode space. Thus, the electrodes 16 and 17 may be separated by slight side etching of the conductive thin film 14 caused in working of the electrodes or $V_{EBF}$ failure may be caused due to insufficient covering of the contact holes 9 and 10, to extremely reduce the yield and high-frequency characteristics of the device.

In order to overcome such disadvantages, this embodiment first employs anisotropic etching such as sputter etching, for example, which hardly causes side etching, similarly to the prior art. In this case, however, the part 14a of the conductive thin film 14 is left in the concave step portion 18 of the barrier metal layer 13, for example, as described above in relation to the prior art, and the emitter and base electrodes 16 and 17 are shorted by movement of the part 14a of the conductive thin film 14 when the barrier metal layer 13 is removed by etching, to reduce the yield.

After the conductive thin film 14 is removed by anisotropic etching, therefore, the electrodes 16 and 17 having fine pattern stripe structure are covered with and protected by the photoresist film 19, and the part 14a of the conductive thin film 14 left on the concave step portion 18 is removed by isotropic wet etching. Thus, the portions at the electrodes 16 and 17 are prevented from side etching and no problem of shorting across the base and the emitter is caused by movement of the part 14a of the conductive thin film 14 left on the concave step portion 18, whereby a semiconductor device having excellent high-frequency characteristics can be obtained in a simple manner.

Although the above embodiment has been described with reference to a high-frequency silicon transistor, the present invention is also applicable to a semiconductor device having fine pattern electrode structure, as well as to a general semiconductor integrated circuit device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a semiconductor device having fine pattern electrode structure, comprising:
   a step of forming an insulating layer over an electrode forming region and a non-electrode forming region on a semiconductor layer, said insulating layer having contact holes in said electrode forming region and a concave step portion in said non-electrode forming region;
   a step of forming a conductor layer having substantially uniform thickness on said semiconductor layer to cover said insulating layer and electrically connecting said conductor layer to said semiconductor layer through said contact holes;
   a step of forming a conductive thin film on said conductor layer;
   a step of forming electrodes on said electrode forming region of said conductive thin film;
   a step of selectively removing said conductive thin film by anisotropic etching through said electrodes serving as masks;
   a step of removing a part of said conductive thin film unremoved in said anisotropic etching step and left on a concave step portion of said conductor layer by isotropic etching in a state of covering said electrodes with a resist film; and
   a step of removing said resist film and thereafter selectively removing said conductor layer by etching through said electrodes serving as masks.

2. A method of fabricating a semiconductor device in accordance with claim 1, comprising:
   providing a base electrode and an emitter electrode in the form of stripes as said electrodes respectively.

3. A method of fabricating a semiconductor device in accordance with claim 1, comprising forming
   said electrodes by electrolytic plating.

4. A method of fabricating a semiconductor device in accordance with claim 3, comprising
   forming said conductive thin film by sputtering, to be employed as a current path in formation of said electrodes by electrolytic plating.

5. A method of fabricating a semiconductor device in accordance with claim 3, wherein
   said conductor film is a barrier metal layer for preventing said semiconductor layer from intrusion of material atoms forming said electrodes and said conductive thin film.

* * * * *